US011760283B2

(12) United States Patent
Sainclivier et al.

(10) Patent No.: US 11,760,283 B2
(45) Date of Patent: Sep. 19, 2023

(54) MODULAR PACKAGING FOR RUGGED ELECTRONICS ENCLOSURES

(71) Applicant: 901D, LLC, Monsey, NY (US)

(72) Inventors: Frederic Sainclivier, Woodcliff Lake, NJ (US); Francois Duvergne, Maplewood, NJ (US)

(73) Assignee: 901D, LLC, Monsey, NY (US)

( * ) Notice: Subject to any disclaimer, the term of this patent is extended or adjusted under 35 U.S.C. 154(b) by 17 days.

(21) Appl. No.: 16/834,282

(22) Filed: Mar. 30, 2020

(65) Prior Publication Data

US 2020/0317147 A1    Oct. 8, 2020

Related U.S. Application Data

(60) Provisional application No. 62/829,785, filed on Apr. 5, 2019.

(51) Int. Cl.
| | | |
|---|---|---|
| *H05K 5/00* | (2006.01) | |
| *H05K 5/02* | (2006.01) | |
| *B60R 16/023* | (2006.01) | |
| *H05K 9/00* | (2006.01) | |
| *H05K 7/20* | (2006.01) | |

(52) U.S. Cl.
CPC ....... *B60R 16/0238* (2013.01); *H05K 5/0017* (2013.01); *H05K 5/0073* (2013.01); *H05K 5/0204* (2013.01); *H05K 5/0247* (2013.01); *H05K 7/20845* (2013.01); *H05K 9/005* (2013.01)

(58) Field of Classification Search
CPC ... B60R 16/0238; B60R 11/00; H05K 5/0073; H05K 5/0017; H05K 9/005; H05K 5/0247; H05K 7/20845; H05K 5/0204
See application file for complete search history.

(56) References Cited

U.S. PATENT DOCUMENTS

| | | | | |
|---|---|---|---|---|
| 4,089,040 A | * | 5/1978 | Paulsen | B64C 1/20 |
| | | | | 174/16.1 |
| 4,153,225 A | * | 5/1979 | Paulsen | H05K 7/20572 |
| | | | | 244/118.1 |
| 4,582,374 A | * | 4/1986 | Conrad | H01R 12/526 |
| | | | | 439/329 |
| 4,699,270 A | | 10/1987 | Bohm | |
| 4,735,583 A | * | 4/1988 | Rudy, Jr. | H01R 13/518 |
| | | | | 439/350 |
| 4,808,115 A | * | 2/1989 | Norton | G02B 6/3897 |
| | | | | 439/271 |
| 4,846,699 A | * | 7/1989 | Glover | H01R 12/7005 |
| | | | | 439/157 |

(Continued)

*Primary Examiner* — Anthony M Haughton
*Assistant Examiner* — Theron S Milliser
(74) *Attorney, Agent, or Firm* — Pearne & Gordon LLP (57) ABSTRACT

A cabinet enclosure for mounting to a vehicle and providing an inner cavity isolated from a surrounding environment. The cabinet enclosure includes a removable module including a frame and a plurality of mounts on the frame for receiving an electrical component. A housing defines the inner cavity and includes a plurality of predefined mounting locations within the inner cavity configured to receive the removable module. The housing is configured to protect the inner cavity from exposure to moisture, heat, vibration and/or electromagnetic forces. An interface element secures the housing to a vehicle.

18 Claims, 7 Drawing Sheets

(56) References Cited

U.S. PATENT DOCUMENTS

| | | | | |
|---|---|---|---|---|
| 5,381,314 | A * | 1/1995 | Rudy, Jr. | H05K 7/1449 257/729 |
| 5,491,979 | A * | 2/1996 | Kull | B64D 11/0007 165/104.28 |
| 5,574,251 | A | 11/1996 | Sevier | |
| 6,469,899 | B2 | 10/2002 | Hastings et al. | |
| 6,751,096 | B2 * | 6/2004 | Aldon | H05K 5/0021 174/377 |
| 7,724,516 | B2 * | 5/2010 | Harder | H05K 7/202 361/679.51 |
| 8,717,776 | B2 * | 5/2014 | Colongo | H05K 7/1449 361/807 |
| 8,967,392 | B1 * | 3/2015 | Czamara | H05K 7/1489 211/26 |
| 9,485,885 | B2 * | 11/2016 | Czamara | F16M 13/00 |
| 9,526,193 | B2 * | 12/2016 | Demange | H05K 7/1497 |
| 10,212,842 | B1 | 2/2019 | Schulze et al. | |
| 10,219,398 | B2 | 2/2019 | Cromarty et al. | |
| 10,724,599 | B2 * | 7/2020 | Embleton | F16F 7/104 |
| 2004/0032717 | A1 * | 2/2004 | Aldon | H05K 9/0015 361/698 |
| 2007/0236881 | A1 * | 10/2007 | Harder | H05K 7/202 361/695 |
| 2007/0283858 | A1 * | 12/2007 | Ballard | B65D 19/0016 108/57.12 |
| 2011/0127379 | A1 * | 6/2011 | Jager | B64C 1/18 244/118.1 |
| 2011/0194269 | A1 * | 8/2011 | Colongo | H05K 7/1448 361/807 |
| 2011/0198445 | A1 * | 8/2011 | Colongo | H05K 7/1449 244/131 |
| 2012/0170175 | A1 | 7/2012 | Silberbauer et al. | |
| 2013/0021733 | A1 * | 1/2013 | Demange | H05K 7/2079 361/679.02 |
| 2015/0181751 | A1 * | 6/2015 | Czamara | H05K 7/1489 361/679.02 |
| 2017/0359918 | A1 | 12/2017 | Klaba et al. | |
| 2019/0234482 | A1 * | 8/2019 | Embleton | F16F 7/104 |

* cited by examiner

MODULAR PACKAGING FOR RUGGED ELECTRONICS ENCLOSURES

CROSS REFERENCE TO RELATED APPLICATIONS

This application claims the benefit of provisional application Ser. No. 62/829,785, filed on Apr. 5, 2019. This application is incorporated herein by reference.

FIELD OF THE INVENTION

The present disclosure is related to rugged and military grade enclosures that ensure Commercial Off The Shelf (COTS) electronics can sustain an array of environmental requirements and continue to operate effectively.

BACKGROUND OF THE INVENTION

Traditionally, COTS electronics are selected to fulfill a defined set of functional requirements and are housed in a cabinet enclosure. The enclosure, sometimes requiring compliance with the present Electronic Industries Alliance (EIA-310) standard, provides some level of protection against various environmental conditions in which the electronics must be able to operate. Presently, some level of customization is usually necessary for the enclosure, so that mechanical and electrical interfaces meet the system defined constraints (such as ship interfaces and layout). This approach introduces challenges and drawbacks as outlined below.

Because of their commercial nature, COTS electronics become obsolete within a few years (3 to 5 generally), and in some cases before the electronic systems and enclosures are fully defined, developed, qualified and fielded. This requires a new COTS component be selected, tested, qualified and fielded. This new component may alter the electrical and mechanical interfaces in the enclosure stack of components, or externally to the enclosure. In turn, this can lead to the enclosure being modified and requalified for the updated system to be approved for service.

Additionally, the enclosure system requirements or interfaces may have to change overtime. This requires some mechanical and electrical alterations to the enclosure. This usually drives logistics efforts to achieve enclosure requalification, minimize alteration to the enclosure surroundings and adhere to the user's availability schedule. In extreme cases, the entire enclosure must be replaced increasing costs for this effort.

Furthermore, as new capabilities or more performant systems are developed, retrofits are needed for the user to benefit from newer technology. In the case of installing enclosures on ships, such work usually requires ship foundations to be altered, and hulls and bulkheads changed including being cut. This mandates planning and timing with ship maintenance, as well as significant funding.

Accordingly, it has been determined by the present disclosure that there is a need for modular COTS packaging in a rugged or ruggedized enclosure that offers scalability, easily accommodates system changes, and addresses the aforementioned shortcomings.

SUMMARY

There is provided a cabinet enclosure for mounting to a vehicle and providing an inner cavity isolated from a surrounding environment. The cabinet enclosure includes a removable module including a frame and a plurality of mounts on the frame for receiving an electrical component. A housing defines the inner cavity and includes a plurality of predefined mounting locations within the inner cavity configured to receive the removable module. The housing is configured to protect the inner cavity from exposure to moisture, heat, vibration and/or electromagnetic forces. An interface element secures the housing to a vehicle.

In the cabinet enclosure, the plurality of predefined mounting locations may include one or more of the following: front fasteners, rear guide pins or rear shock pins for insertion and extraction of the removable module into and from the inner cavity of the cabinet enclosure.

In the cabinet enclosure, the housing may include a front opening and a door for closing the front opening. The front opening may be configured to allow the removable module to be removed from and inserted into the housing through the front opening.

The cabinet enclosure may further include an electrical harness that is secured in the inner cavity. The electrical harness may include a plurality of connectors for selectively connecting the electrical component of the removable module to an external panel of the cabinet enclosure and/or to an electrical component of an additional removable module.

The cabinet enclosure may further include a panel positioned in the inner cavity for providing electromagnetic isolation of the electrical component of the removable module from another electrical component mounted in the inner cavity of the housing.

The cabinet enclosure may further include a plurality of harnesses disposed within the inner cavity of the housing and additional electrical components mounted to additional removable modules wherein the plurality of harnesses separately inter-connect the additional electrical components to each other and/or to an external panel mounted to the housing.

In the cabinet enclosure, the electrical component may be one of the following: a communication module (with Ethernet switches and routers), a computation module (with servers, network attached storage devices) or a Human-Machine-Interface module (with visual or audible alarms, KVM switches, displays, printers).

In the cabinet enclosure, the removable module may include a set of standardized electrical interfaces on a rear panel to interface with an electrical harness disposed in the inner cavity of the housing.

The cabinet enclosure may further include at least one of a cooling unit and a power distribution unit disposed in the inner cavity.

In the cabinet enclosure, the removable module may include a ballast element mounted in one of a plurality of positions on the removable module.

In the cabinet enclosure, the removable module may include electromagnetic interference mitigating features for providing electromagnetic isolation of the removable module from additional removable modules mounted in the inner cavity of the housing.

In the cabinet enclosure, the electromagnetic interference mitigating features may include one or more of the following: conductive panels, conductive gaskets, conductive screens for air ways or electrical filters on power or signal cables.

The cabinet enclosure may further include an additional removable module wherein the removable module and the additional removable module are independently removable from and insertable into the inner cavity of the housing.

The cabinet enclosure may further include at least one of guides, a railing system or slides mounted to the housing and engaging the removable module for allowing the removable module to be inserted into and removed from the inner cavity of the housing.

There is also provided a removable module for insertion into and removal from an enclosure. The removable module may include a frame, a plurality of mounts on the frame for receiving an electrical component, and a set of standardized electrical interfaces on a rear panel to interface with an electrical harness.

The removable module may include a ballast element mounted in one of a plurality of positions on the removable module.

The removable module may include electromagnetic interference mitigating features for providing electromagnetic isolation of the removable module from neighboring components.

In the removable module, the electromagnetic interference mitigating features may include one or more of the following: conductive panels, conductive gaskets, conductive screens for air ways or electrical filters on power or signal cables.

In the removable module, the electrical component may be one of the following: a communication module (with Ethernet switches and routers), a computation module (with servers, network attached storage devices) or a Human-Machine-Interface module (with visual or audible alarms, KVM switches, displays, printers).

The present disclosure provides a rugged cabinet enclosure designed to remain in the field for the entire projected life span of the vehicle and/or location at which it is installed.

The present disclosure also provides such a ruggedized enclosure that is capable of housing COTS electronics, while ensuring the electronics can sustain a variety of environmental conditions yet maintain operating efficiency.

In some embodiments, the enclosure is provided with mechanical and electrical interfaces that can remain constant through the service life of the enclosure, even when internal COTS are removed, changed, or upgraded.

In some embodiments, the enclosure is capable of being easily disassembled and re-assembled as many times as necessary throughout the service life of the enclosure.

In some embodiments, the enclosure includes removable and adjustable ballasts to retain established mechanical properties as the enclosure payload properties (such as mass and center of gravity location) change over time.

In some embodiments, the enclosure is resiliently or hard mounted to a permanent location or vehicle such as a ship, while not being part of the vehicle frame or structure.

In some embodiments, the enclosure include modules that can be removed from and added to the enclosure, so that each module can hold COTS electronics.

In some embodiments, the module has various mounts or mounting, and fasteners to easily allow for adding, removing, or changing COTS electronics with minimal changes required to the enclosure.

In some embodiments, the module includes housekeeping services such as electronic controls, alarms, air cooling, and electrical interfaces and electrical harness support.

In some embodiments, the module has electromagnetic shielding panels and screens that reduce or eliminate electromagnetic interference with the COTS electronics.

The above-described and other features and advantages of the present disclosure will be appreciated and understood by those skilled in the art from the following detailed description, drawings, and appended claims.

DETAILED DESCRIPTION

As used herein, the word "ship" is not meant to convey the application of the enclosures and enclosure modules disclosed herein to be exclusively for use on marine vessels. The word "ship" only depicts an example of a type of vehicle, where the enclosures and modules can be used. The enclosures and modules can be applied to other vehicles for underwater, ground and airborne applications.

This present disclosure relates to modular COTS packaging for rugged electronics enclosures. The enclosure includes a cabinet structure and electro-mechanical modules to shelter commercial grade electronics from harsh environments. Examples of harsh environmental conditions include, but are not limited to, shock, vibration, electromagnetic interference, power disturbances, water drip, humidity, and high or low temperatures.

Figure 1:
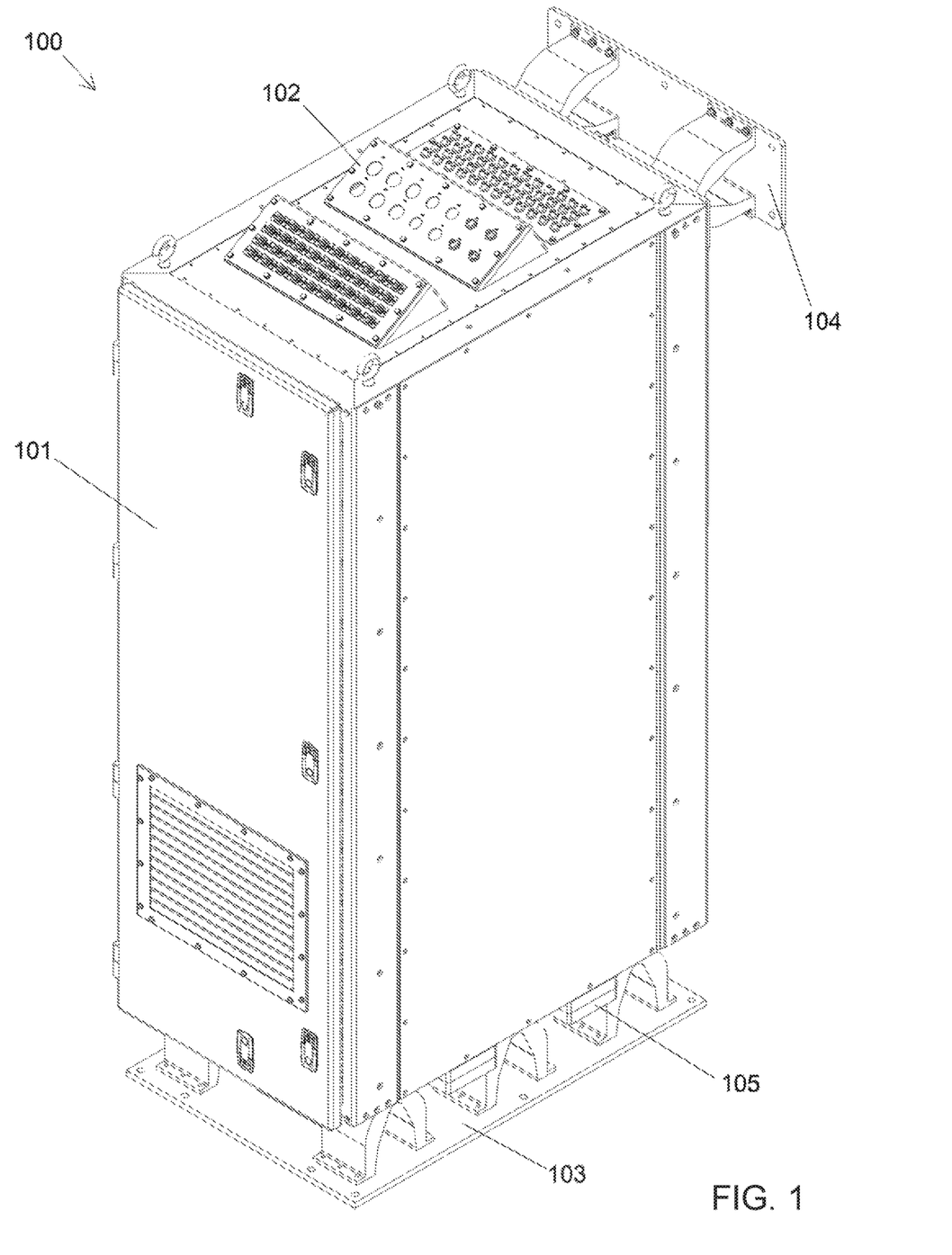
FIG. 1 is an exemplary embodiment of a ruggedized enclosure according to the present disclosure.

Referring to the drawings and in particular FIG. 1 an exemplary ruggedized enclosure is generally represented by reference numeral 100. Enclosure 100 has a front hinged door 101, electrical interface panels 102, a resilient mounting system 103 and 104, and weight ballasts 105. Advantageously, the present disclosure provides for a standard set of interfaces, such as interface 102 for COTS electronics and other components, allowing for the efficient removal, swapping, modification, addition or replacement of these interfaces to the enclosure, when the requirements for the enclosure change over time. These changes to the interfaces, can be made without requiring modification to the structure of the overall enclosure, thereby reducing costs.

The enclosure or cabinet structure 100 shown in FIG. 1 is of rugged design and construction to sustain a life-long exposure to harsh environmental conditions including those noted above. Enclosure 100 allows for disassembly and re-assembly as many times as necessary so to be transported from one location to another, from the factory to the final installation locations, such as onboard a ship and everywhere in between, yet not requiring for any modification to the location's infrastructure, such as ship hull, bulkheads, passage ways or other surrounding structures and equipment.

Enclosure 100 has a set of mechanical and electrical interfaces, such as items 102, 103 and 104, which can remain constant for the life expectancy of the enclosure onboard a ship. This is consistent with the goal to prevent modification to the cabinet surroundings as the housed COTS electronics are modified, exchanged, replaced.

Figure 2:
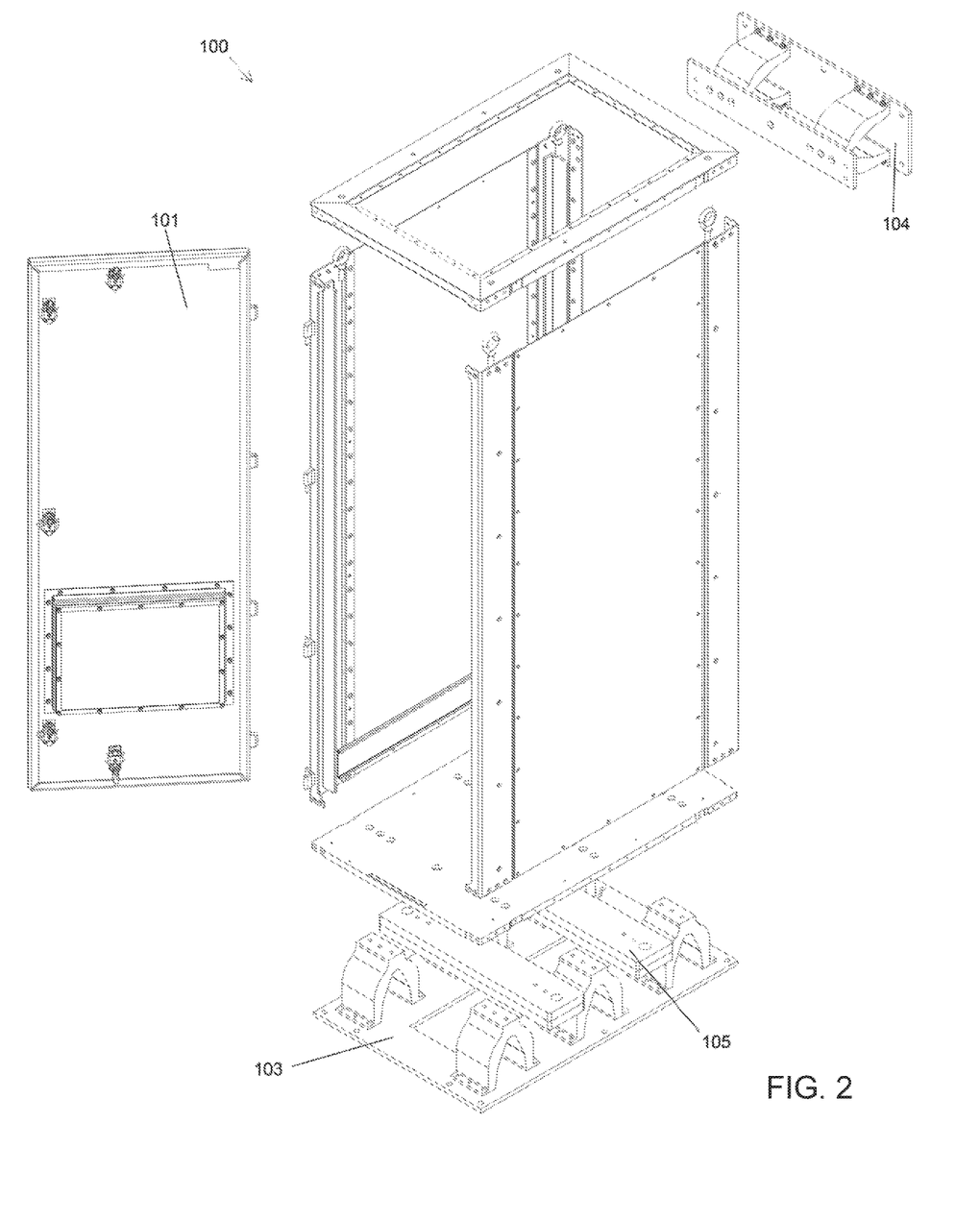
FIG. 2 is an exemplary embodiment of the enclosure as shown in FIG. 1, partially disassembled.

As shown in FIG. 2, disassembly of enclosure 100 can be partial or complete, and is preferably achieved by mechanical fasteners, such as but not limited to, screws, nuts and bolts.

In some embodiments, enclosure 100 has a design and construction that allows for partial or complete disassembly (by means of fasteners or other mechanical-type devices), so to be hatchable (enclosure 100 can be disassembled into smaller pieces allowing for the pieces to fit through an access hatch as partially disassembled, or fully disassembled) and re-assembled and installed at final destination location in an onboard vehicle with no disturbance to hull, bulkhead, passage ways, other structures, and surrounding equipment. In some embodiments, enclosure 100 is able to fit through hatches as a whole without need for disassembly.

Figure 3:
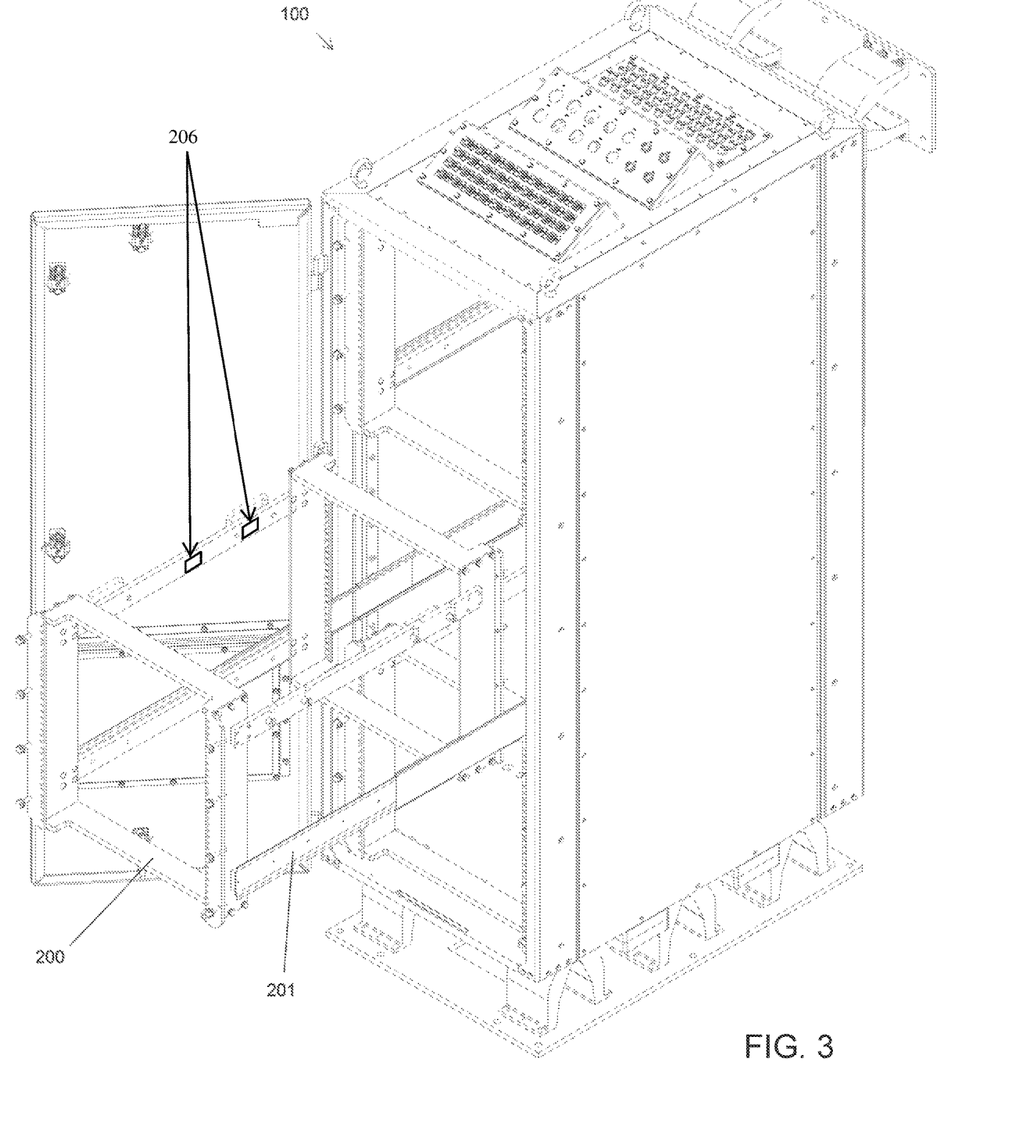
FIG. 3 is an exemplary enclosure according to the present disclosure.
Figure 4:
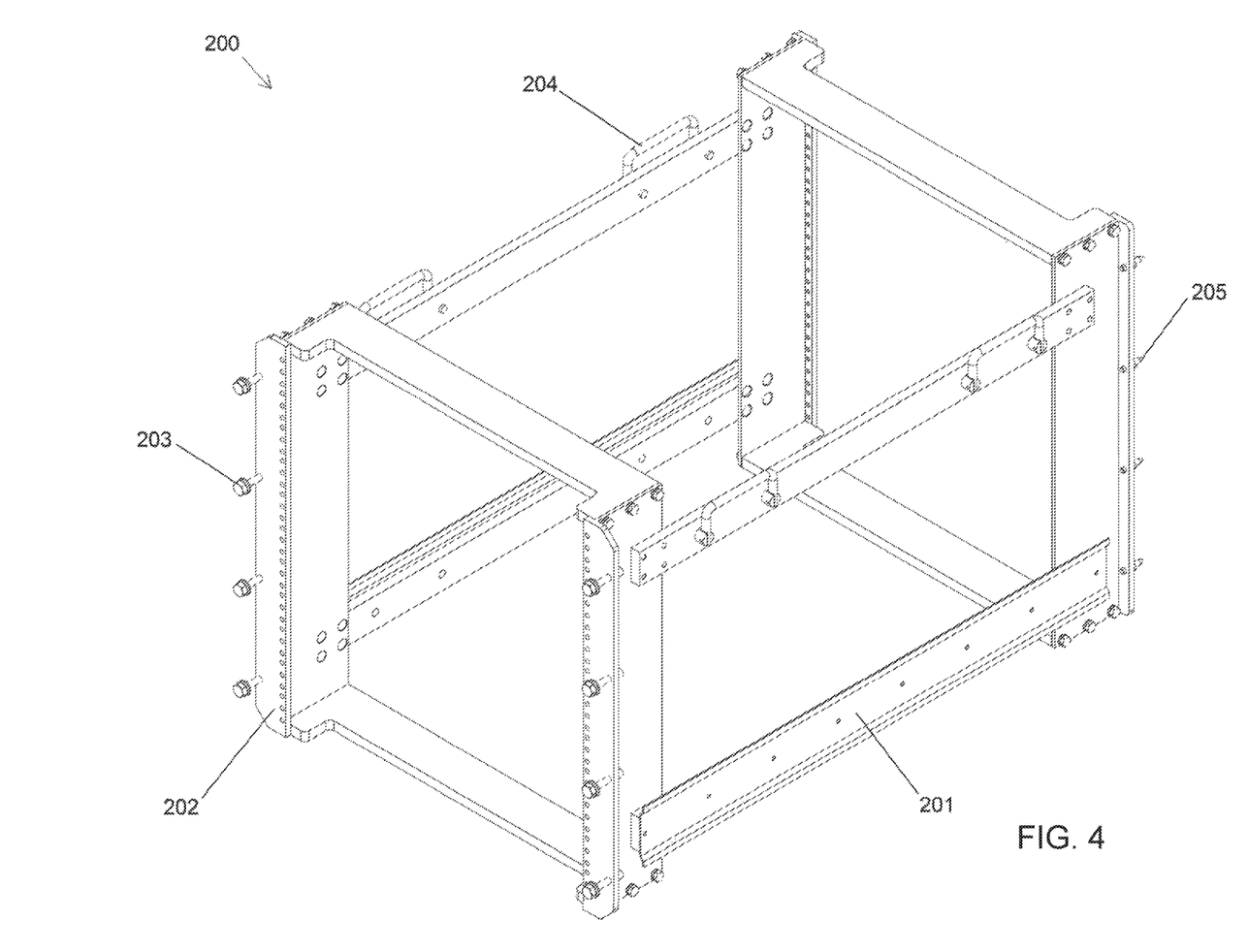
FIG. 4 is an exemplary module used in the enclosure according to the present disclosure.
Figure 5:
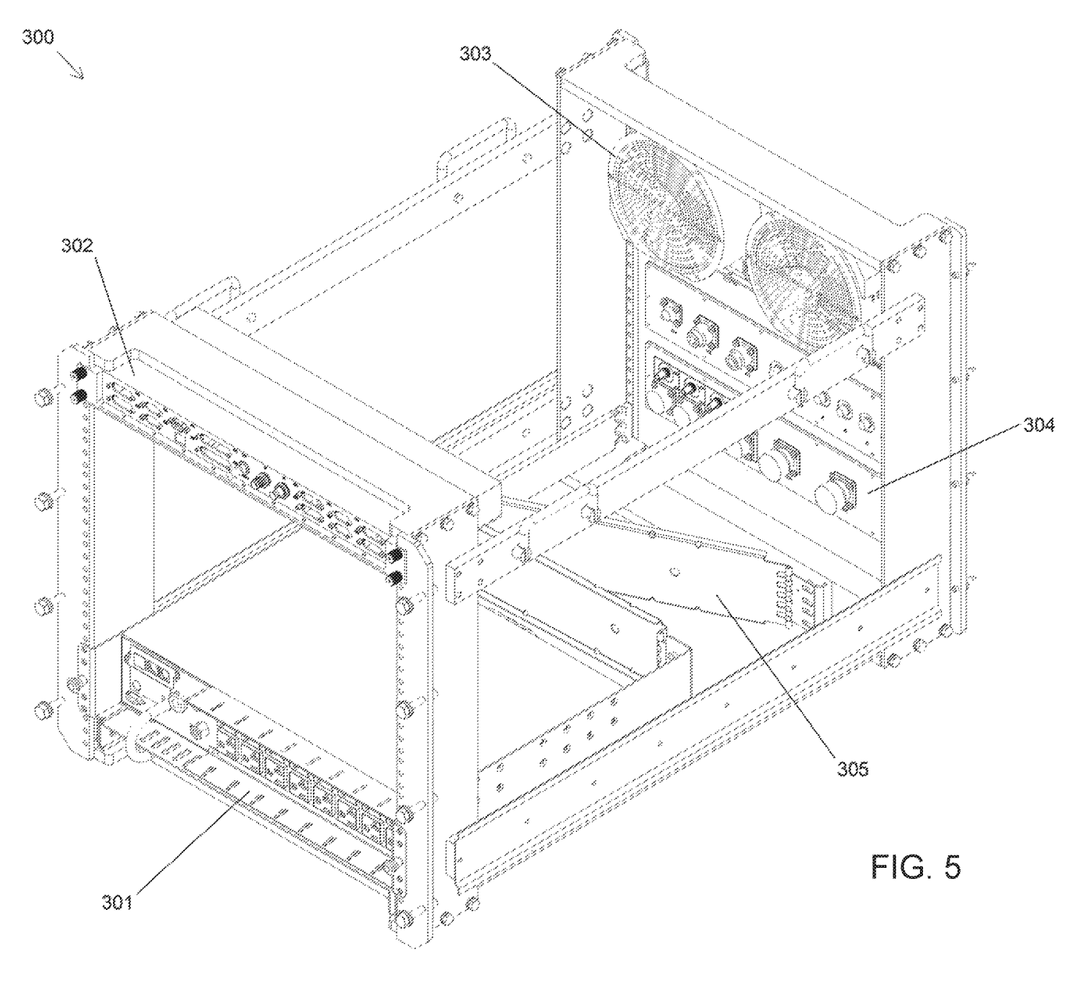
FIG. 5 is another exemplary module used in an enclosure according to the present disclosure.
Figure 6:
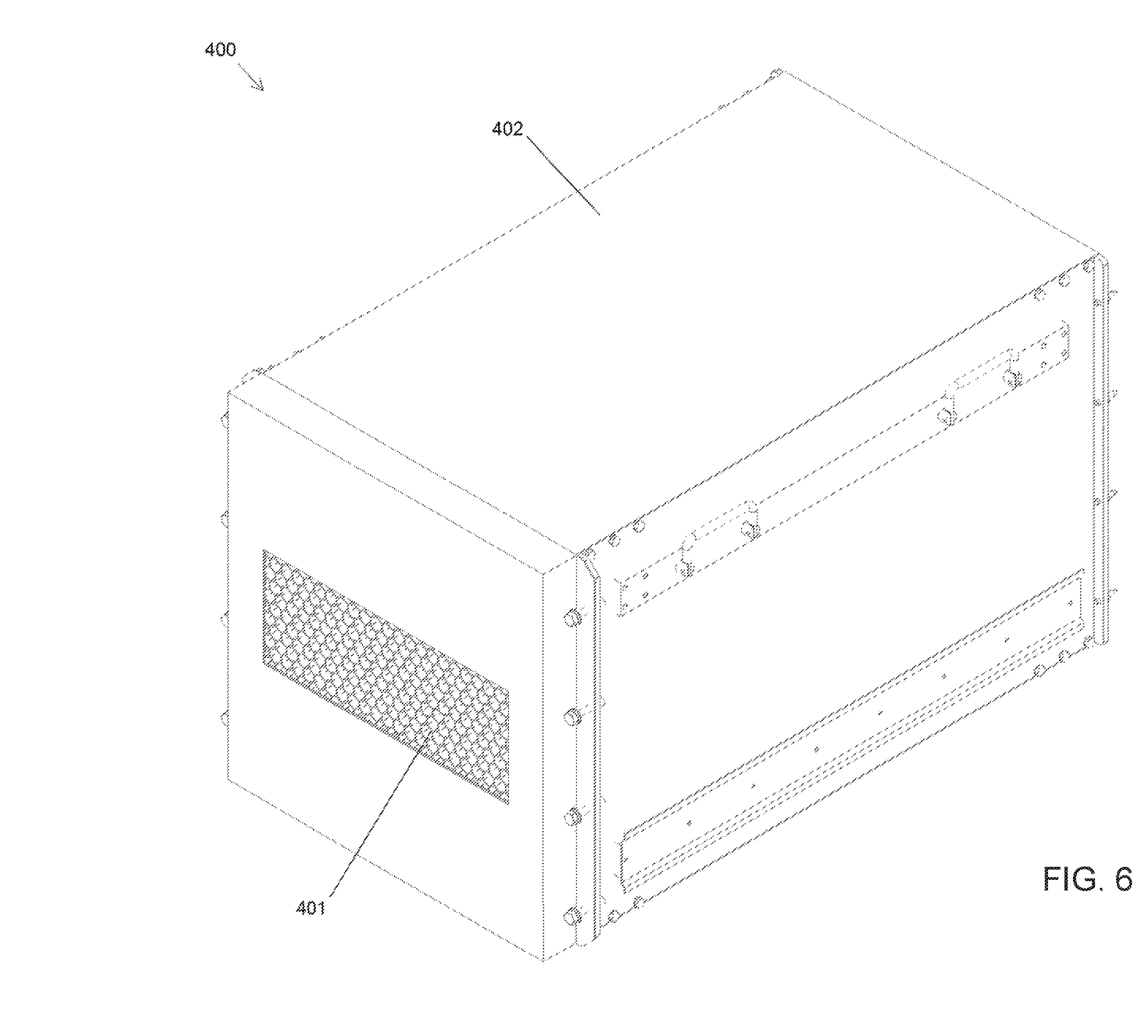
FIG. 6 is another exemplary module with electromagnetic interference shielding used in an enclosure according to the present disclosure.

Referring to FIG. 3 enclosure 100 is shown with the door 101 open to reveal the basic mechanical arrangement of module 200. In some embodiments, three modules 200 can fit in enclosure 100. An exemplary module 200 is depicted being racked out in the center of enclosure 100, using a sliding mechanism 201. It should be noted that any reference to modules hereafter can be referring to any of modules 200, 300, or 400 as shown in FIGS. 4-6 below.

In some embodiments, module 200 can feature EIA-310 compliant mounts or mounting provisions in a variety of sizes (in U height and depth). For example, module 200 can feature a set of standardized electrical interfaces on a rear panel to interface with the enclosure electrical harness. Also, module 200 can allow for the COTS items to retain all their mechanical and electrical properties when installed.

In some embodiments, module 200 includes removable and adjustable ballasts 206. The ballasts 206 can be secured or removed by the use of mechanical devices such as fasteners. The ballasts 206 retain established mechanical properties, such as mass, center of gravity location. Further the ballasts 206 remain in compliance with human factors, such as 2-man lift weight limitations.

In some embodiments, module 200 and enclosure 100 have supporting guides that mate and/or rail systems, and/or slides for the purpose of easily and safely inserting and extracting each module individually from enclosure 100.

Referring to FIG. 4, module 200 has a sliding mechanism 201, a mounting pattern 202 for COTS mounting, captive fasteners 203, and rear shock pins 205 to interface with enclosure 100, and a set of handles 204 for transport. In some embodiments, mounting pattern 202 is a standard EIA-310 pattern for COTS mounting. In some embodiments, the use of sliding mechanism 201, mounting pattern 202, fasteners 203, and rear shock pins 205, when used alone and/or in combination advantageously allows for easier manipulation, removal, adjustment, and insertion of the module 200 in enclosure 100.

Enclosure 100 allows module 200, as shown in FIGS. 3 and 4, to be installed therein. For ease of access and maintenance, one or more modules 200 can be inserted and extracted from the front of enclosure 100, as shown in FIG. 3, using a mounting or mounting scheme. The mounting shown in FIG. 3 includes a combination of supporting slide rails 201, front captive fasteners 203, and rear guide pins 205. In some embodiments, the mounting is standardized so to allow any module to be installed at any location in enclosure 100. The mounting also permits future modules, loaded with electronics, to be installed and replace older modules needing service, repair or removal.

In some embodiments, enclosure 100 has a pre-defined mounting pattern to accommodate installation and removal of modules 200, from the front of the enclosure. The mounting pattern can include some/all of the following: front fasteners, rear guide pins, rear shock pins, and sliding mechanism to ease insertion and extraction of module from the enclosure. This provides standardized mechanical devices to interface with modules.

Modules 200 can be transported to and from the ship using handles 204. While modules 200 are built in a manner to allow disassembly and reassembly, it is envisioned these modules be of an overall size compatible with ship walkways.

As electronics modules change through time at a user's location, such as onboard a ship, enclosure 100 has weight ballasts 105 to allow adjustment and compensate for such change. This ensures that the overall loaded cabinet or enclosure 100 retains known mechanical properties, such as natural frequencies, so to remain certified to a user's standards and deemed sea worthy when used on a ship. Advantageously, the use of weight ballasts 105 allows compensation for changes in sprung mass, and shifts in the center of gravity in the enclosure 100 as the payload of module 200 changes over time. Advantageously, adjusting the weight ballasts 105, allows the overall enclosure 100 to retain its natural frequency, and removes the need for requalification of the enclosure 100 for shock and vibration standards.

Referring to FIG. 5, module 300 has a variety of housekeeping components; such as power distributions 301, controls and alarms 302, air cooling 303, electrical connector interfaces 304, and electrical harness support 305. Advantageously, the use of the aforementioned parts 301, 302, 303 and 304, on any of modules 200, 300 and 400, allow for increased versatility and adaptability of each module in the enclosure, and thereby reduces the need for modifications to the overall enclosure 100.

In some embodiments, each module 300 offers a standard mounting scheme to COTS electronics. An example of such standard is the EIA-310 compliant vertical rails. Modules 300 can have a variety of sizes, defined in U-unit of height per the EIA-310 standard, and depth. To complement the interface to COTS, module 300 can include electrical interface panels 304 and electrical cable support 305.

In some embodiments, each module 300 is designed and built to be self-sufficient in the cabinet or enclosure 100, with housekeeping features added. These augmented capabilities can include any combination of power distribution 301, controls and monitoring alarms 302, and cooling fans 303. It should be noted that these capabilities at the module level can be supplemental to similar function already embedded in enclosure 100 as per FIG. 1. Additionally, it should be noted that components 301 and 302 are depicted only as an exemplary embodiment as mounted to the front EIA rails but could, instead, be installed on the rear or the sides of the module frame, thus freeing additional space to mount COTS electronics.

Figure 7:
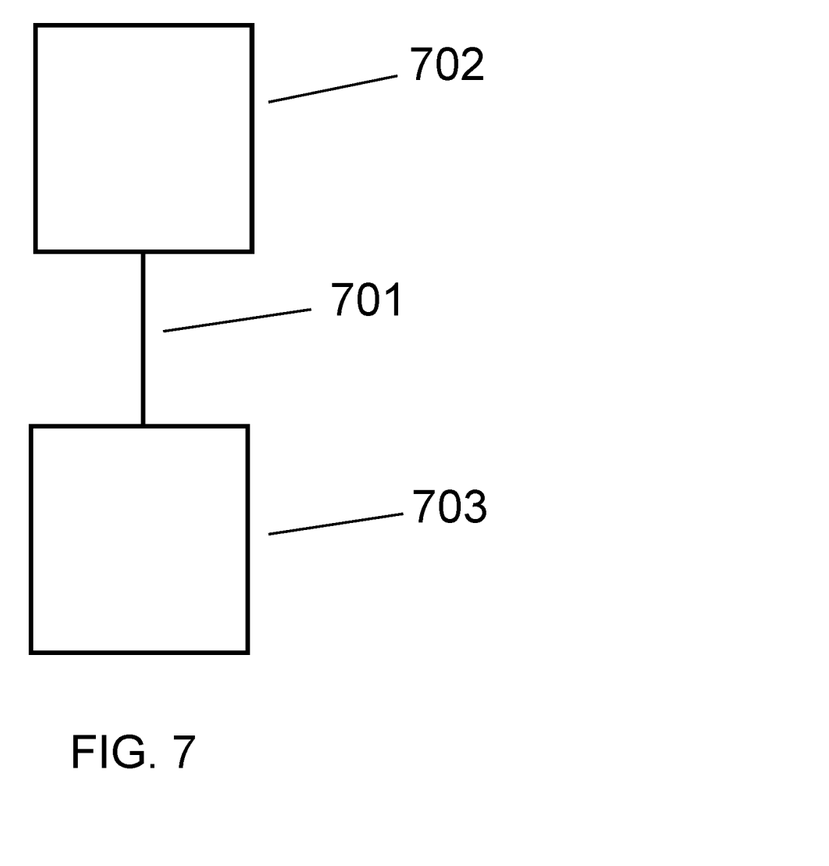
FIG. 7 is a schematic drawing of an electrical component of one removable module connected by a connector of an electrical harness to an electrical component of an additional removable module.

In some embodiments, cabinet or enclosure 100 has a pre-defined electrical harness 701 (See FIG. 7), with one or more supporting cable retractors, ladders, slides, and other apparatus, connected to the enclosure external surfaces (such as Input/output panels with connectors and human interface panels with indicators and switches) to remain secured and fully functional regardless of modules 702, 703 being connected to the harness within enclosure 100. This provides that standardized electrical means or devices can interface with the modules 702, 703.

In some embodiments, enclosure 100 offers added housekeeping capabilities, such as power distribution, cooling, self-diagnostics (monitoring power or cooling failure). These additional capabilities can be present in the individual modules and/or the COTS electronics installed in the modules.

Referring to FIG. 6, module 400 is shown with electromagnetic interference shielding panels 402 and shielded screen 401 for cooling airflow.

While enclosure 100 as depicted in FIG. 1 offers the housed COTS some electromagnetic interference (EMI) shielding from and to the ship environment, EMI shielding can also be offered on a module basis, shown in FIG. 6. Module 400 can include a set of panels 402 of conductive material all around. If and when cooling is required, shielded screen 401 can be mounted to panels 402 on any side of module 400, in conjunction or independently of module cooling fans, such as cooling fans 303 shown in FIG. 5.

In some embodiments, enclosure 100 has ways or means to segregate modules 400 for the purpose of mitigating effects of electromagnetic interferences. This segregation can include physical barriers and/or dividers, of conductive properties. Also, in lieu of a single electrical harness, multiple harnesses can be used to interfaces between modules 400 and/or from modules to the external interfaces of enclosure 100 to prevent cross-talk, and protect EMI "receptor" cables/signals from "emitter" cables.

In some embodiments, module 400 includes electromagnetic interference mitigating features, to shield the electronics it contains from the other modules and enclosure 100. Such electromagnetic interference mitigating features at the module level can be sole or in addition to other features, described above, of enclosure 100. Electromagnetic interference mitigating features include, but are not limited to, one or more conductive panels, conductive gaskets, conductive screens for air ways (sometimes referred to as honeycomb or wire mesh), electrical filters on power and signal cables.

In some embodiments, a modular electronics packaging system is provided. This system allows for the use of COTS to be integrated and tested outside of a rugged enclosure, against a constant subset of environmental requirements, to minimize cost of development and qualification for such COTS to be installed into a vehicle and fielded for a specific purpose.

In some embodiments, a modular electronics packaging system allows for the use of COTS for the purpose of meeting a specific subset of functional requirements including, but not limited to, a communication module (with Ethernet switches and routers), a computation module (with servers, network attached storage devices), Human-Machine-Interface module (with visual or audible alarms, KVM (keyboard, video and mouse) switches, displays, printers).

While the present disclosure has been described with reference to one or more exemplary embodiments, it will be understood that various changes can be made and equivalents can be substituted for elements thereof without departing from the scope of the present disclosure. In addition, many modifications can be made to adapt a particular situation or material to the teachings of the present disclosure without departing from the scope hereof.

What is claimed is:

1. A cabinet enclosure for mounting to a vehicle and providing an inner cavity isolated from a surrounding environment, the cabinet enclosure comprising:
   at least two removable modules, each removable module including a frame and a plurality of mounts on the frame for receiving an electrical component;
   a housing defining the inner cavity and including a plurality of predefined mounting locations within the inner cavity configured to receive the at least two removable modules through a front opening of the housing, the housing configured to protect the inner cavity from exposure to moisture, heat, vibration and/or electromagnetic forces;
   wherein each of the at least two removable modules includes front fasteners and rear shock pins or rear guide pins for insertion and extraction of the respective removable module into and from the inner cavity of the housing;
   at least one panel positioned on each of the at least two removable modules for providing electromagnetic isolation of the electrical component of one of the at least two removable modules from another electrical component in the other of the at least two removable modules;
   each of the at least two removable modules including electromagnetic interference mitigating features for providing electromagnetic isolation of the respective removable module from additional removable modules mounted in the inner cavity of the housing, the electromagnetic interference mitigating features including at least a conductive screen for air ways;
   a door hingedly attached to the housing and moveable between a first open position relative to the housing for allowing access to the at least two removable modules and the inner cavity and a second closed position for sealing an entirety of the front opening; and
   an interface element for securing the housing to a vehicle.

2. The cabinet enclosure of claim 1, further comprising an electrical harness secured in the inner cavity, the electrical harness including a plurality of connectors for selectively connecting the electrical component of one of the at least two removable modules to an external panel of the cabinet enclosure and/or to an electrical component of an additional removable module.

3. The cabinet enclosure of claim 1, further comprising a plurality of harnesses disposed within the inner cavity of the housing and additional electrical components mounted to additional removable modules wherein the plurality of harnesses separately inter-connect the additional electrical components to each other and/or to an external panel mounted to the housing.

4. The cabinet enclosure of claim 1, wherein the electrical component is one of the following: a communication module (with Ethernet switches and routers), a computation module (with servers, network attached storage devices) or a Human-Machine-Interface module (with visual or audible alarms, KVM switches, displays, printers).

5. The cabinet enclosure of claim 1, wherein each of the at least two removable modules includes a set of standardized electrical interfaces on a rear panel to interface with an electrical harness disposed in the inner cavity of the housing.

6. The cabinet enclosure of claim 1, further comprising at least one of a cooling unit and a power distribution unit disposed in the inner cavity.

7. The cabinet enclosure of claim 1, wherein each of the at least two removable modules includes a ballast element mounted in one of a plurality of positions on the removable module.

8. The cabinet enclosure of claim 1, wherein the electromagnetic interference mitigating features further include one or more of the following: conductive panels, conductive gaskets, or electrical filters on power or signal cables.

9. The cabinet enclosure of claim 1, wherein each of the at least two removable modules is independently removable from and insertable into the inner cavity of the housing.

10. The cabinet enclosure of claim 1, further comprising at least one of guides, a railing system or slides mounted to the housing and engaging each of the at least two removable modules for allowing each of the at least two removable modules to be inserted into and removed from the inner cavity of the housing.

11. A cabinet enclosure for mounting to a vehicle and providing an inner cavity isolated from a surrounding environment, the cabinet enclosure comprising:
   at least two removable modules, each removable module including a frame and a plurality of mounts on the frame for receiving an electrical component;
   a housing defining the inner cavity and including a plurality of predefined mounting locations within the inner cavity configured to receive each of the at least two removable modules through a front opening of the housing, the housing configured to protect the inner cavity from exposure to moisture, heat, vibration and/or electromagnetic forces;
      wherein each of the at least two removable modules includes front fasteners and rear shock pins or rear guide pins for insertion and extraction of the respective removable module into and from the inner cavity of the housing;
   at least one panel positioned on each of the at least two removable modules for providing electromagnetic isolation of the electrical component of one of the at least two removable modules from another electrical component in the other of the at least two removable modules;
   a door hingedly attached to the housing and moveable between a first open position relative to the housing for allowing access to each of the at least two removable modules and the inner cavity and a second closed position for sealing an entirety of the front opening;
   an interface element for securing the housing to a vehicle; and
   at least one of a cooling unit and a power distribution unit disposed in the inner cavity;
   wherein each of the at least two removable modules includes a ballast element mounted in one of a plurality of positions on the removable module;
   wherein each of the at least two removable modules includes electromagnetic interference mitigating features for providing electromagnetic isolation of one of the at least two removable modules from the other of the at least removable; and
   wherein the electromagnetic interference mitigating features include conductive screens for air ways.

12. The cabinet enclosure of claim 11, further comprising an electrical harness secured in the inner cavity, the electrical harness including a plurality of connectors for selectively connecting the electrical component of one of the at least two removable modules to an external panel of the cabinet enclosure and/or to an electrical component of an additional removable module.

13. The cabinet enclosure of claim 11, further comprising a plurality of harnesses disposed within the inner cavity of the housing and additional electrical components mounted to additional removable modules wherein the plurality of harnesses separately inter-connect the additional electrical components to each other and/or to an external panel mounted to the housing.

14. The cabinet enclosure of claim 11, wherein the electrical component is one of the following: a communication module (with Ethernet switches and routers), a computation module (with servers, network attached storage devices) or a Human-Machine-Interface module (with visual or audible alarms, KVM switches, displays, printers).

15. The cabinet enclosure of claim 11, wherein at least one of the removable modules includes a set of standardized electrical interfaces on a rear panel to interface with an electrical harness disposed in the inner cavity of the housing.

16. The cabinet enclosure of claim 11, wherein at least one of the at least two removable modules is independently removable from and insertable into the inner cavity of the housing.

17. The cabinet enclosure of claim 11, further comprising at least one of guides, a railing system or slides mounted to the housing and engaging each of the at least two removable modules for allowing a respective removable module to be inserted into and removed from the inner cavity of the housing.

18. The cabinet enclosure of claim 11, wherein the electromagnetic interference mitigating features further include conductive panels, conductive gaskets, or electrical filters on power or signal cables.

* * * * *